(12) United States Patent
Jeon et al.

(10) Patent No.: US 9,431,334 B2
(45) Date of Patent: Aug. 30, 2016

(54) SEMICONDUCTOR DEVICE HAVING SINGLE LAYER SUBSTRATE AND METHOD

(71) Applicant: Amkor Technology, Inc., Chandler, AZ (US)

(72) Inventors: Hyung Il Jeon, Gyeonggi-do (KR); Byong Jin Kim, Gyeonggi-do (KR); Gi Jeong Kim, Gyeonggi-do (KR); Jae Min Bae, Seoul (KR); Tae Ki Kim, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/593,310

(22) Filed: Jan. 9, 2015

(65) Prior Publication Data

US 2016/0027753 A1    Jan. 28, 2016

(30) Foreign Application Priority Data

Jul. 28, 2014   (KR) ........................ 10-2014-0095708

(51) Int. Cl.
*H01L 23/28* (2006.01)
*H01L 23/498* (2006.01)
(Continued)

(52) U.S. Cl.
CPC ....... *H01L 23/49838* (2013.01); *H01L 21/486* (2013.01); *H01L 21/78* (2013.01); *H01L 23/3128* (2013.01); *H01L 23/49827* (2013.01); *H01L 24/97* (2013.01); *H01L 25/105* (2013.01);
(Continued)

(58) Field of Classification Search
CPC . H01L 21/56; H01L 21/3226; H01L 21/187; H01L 21/2007; H01L 21/28158; H01L 21/76205; H01L 23/4952; H01L 23/3114; H01L 23/315; H01L 23/3157; H01L 23/488; H01L 24/10; H01L 24/04; H01L 24/85

USPC ....... 257/678, 774, 787, 700, 734, 735, 737, 257/772, 777, 779, 780, 782, E21.006, 257/E21.166, E21.174, E21.502, E21.503, 257/E21.504, E21.505, E21.508, E21.511
See application file for complete search history.

(56) References Cited

U.S. PATENT DOCUMENTS

| 8,101,460 B2 * | 1/2012 | Pagaila ................. H01L 21/561 438/109 |
| 8,222,716 B2 * | 7/2012 | Bayan ................. H01L 21/6835 257/666 |

(Continued)

FOREIGN PATENT DOCUMENTS

| KR | 10-2009-0114493 A | 11/2009 |
| KR | 10-2014-0057982 A | 5/2014 |

OTHER PUBLICATIONS

Office Action received from Korean Patent Office in Korean; English Translation Not Available; Date: Dec. 30, 2015; 6 pages.

*Primary Examiner* — David Nhu
(74) *Attorney, Agent, or Firm* — Kevin B. Jackson

(57) ABSTRACT

In one embodiment, a semiconductor device includes a single layer substrate having an insulation layer and conductive patterns on a first surface of the insulation layer. A semiconductor die is attached on a first surface of the single layer substrate and electrically connected to the conductive patterns. Conductive bumps are also on the first surface of the single layer substrate and electrically connected to the semiconductor die through the conductive patterns. An encapsulant overlaps at least portions of the first surface of the single layer substrate. The conductive bumps are at least partially exposed in the encapsulant.

20 Claims, 7 Drawing Sheets

(51) Int. Cl.
   *H01L 21/78*      (2006.01)
   *H01L 21/48*      (2006.01)
   *H01L 23/31*      (2006.01)
   *H01L 25/10*      (2006.01)
   *H01L 25/00*      (2006.01)
   *H01L 23/00*      (2006.01)
   *H01L 21/56*      (2006.01)

(52) U.S. Cl.
   CPC .............. *H01L 21/561* (2013.01); *H01L 24/16* (2013.01); *H01L 24/81* (2013.01); *H01L 25/50* (2013.01); *H01L 2224/16227* (2013.01); *H01L 2224/81005* (2013.01); *H01L 2224/97* (2013.01); *H01L 2225/1023* (2013.01); *H01L 2225/1058* (2013.01); *H01L 2924/1533* (2013.01); *H01L 2924/15321* (2013.01); *H01L 2924/18161* (2013.01)

(56) References Cited

U.S. PATENT DOCUMENTS

| | | | |
|---|---|---|---|
| 8,263,437 B2 * | 9/2012 | Lin | ................. H01L 25/16 438/124 |
| 9,064,936 B2 * | 6/2015 | Lin | .................... H01L 21/6836 |
| 2014/0124906 A1 | 5/2014 | Park et al. | |
| 2015/0287708 A1 * | 10/2015 | Lin | ...................... H01L 25/50 438/109 |

* cited by examiner

SEMICONDUCTOR DEVICE HAVING SINGLE LAYER SUBSTRATE AND METHOD

CROSS-REFERENCE TO RELATED APPLICATIONS

This application claims priority to Korean Patent Application No. 10-2014-0095708 filed on Jul. 28, 2014, which is expressly incorporated by reference herein.

BACKGROUND

The present invention relates, in general, to electronics, and more particularly, to semiconductors, structures thereof, and methods of forming semiconductor devices.

As today's semiconductor industry has appreciated the need for smaller, high-performance electronic products, a wide variety of techniques for providing high-capacity semiconductor devices are being actively researched and developed. In general, a semiconductor device includes a semiconductor die fabricated by processing a wafer and forming an integrated circuit (IC) on the wafer. The semiconductor device is completed by mounting the semiconductor die on one surface of a substrate, such as a printed circuit board and forming conductive members as external input/output members on the other surface of the substrate.

However, the printed circuit board may include multiple layers of conductive layers and insulation layers (i.e., a multiple-layer substrate) to achieve a higher integration level, and conductive bumps and a semiconductor die are mounted on different surfaces of a substrate, which may increase the overall thickness of the semiconductor device, making the semiconductor device bulky.

Accordingly, it is desirable to have a semiconductor device structure and method that achieves a higher integration level and also reduces the overall thickness thereof.

Figure 1:
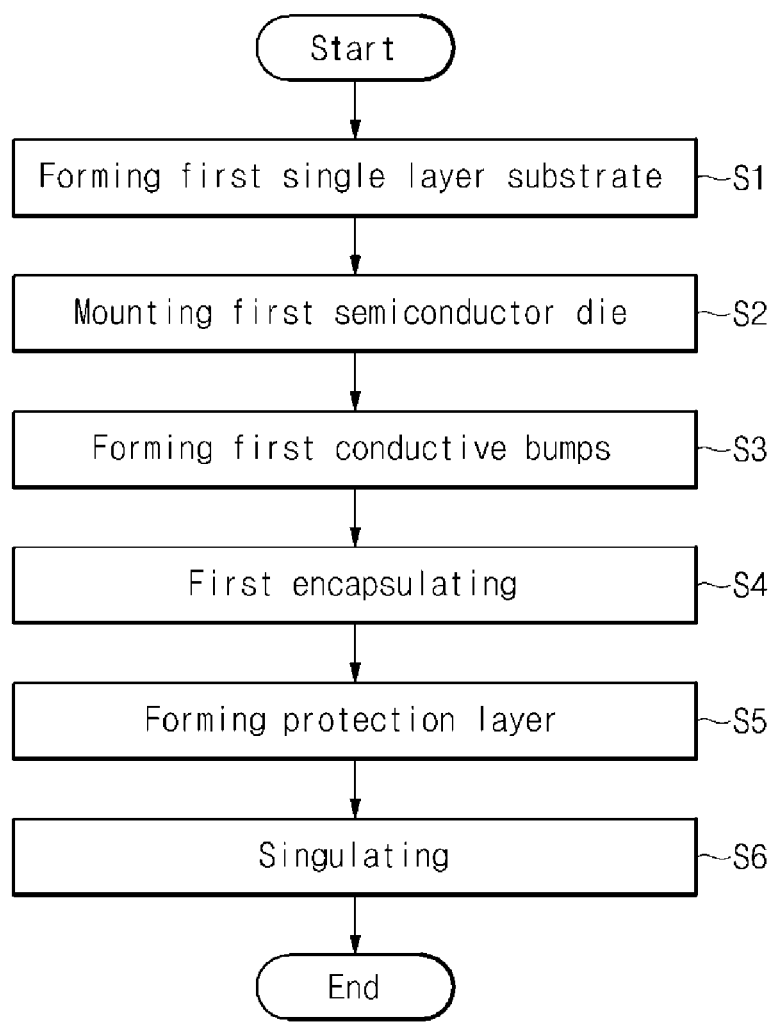
FIG. 1 is a flowchart illustrating a manufacturing method of a semiconductor device in accordance with an embodiment of the present invention.

For simplicity and clarity of illustration, elements in the figures are not necessarily drawn to scale, and the same reference numbers in different figures denote generally the same elements. Additionally, descriptions and details of well-known steps and elements are omitted for simplicity of the description. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of the word approximately or substantially means a value of an element is expected to be close to a state value or position. However, as is well known in the art there are always minor variances preventing values or positions from being exactly stated. As used herein, the singular forms are intended to include the plural forms as well, unless the context clearly indicates otherwise. It will be understood that, although the terms first, second, etc. may be used herein to describe various members, elements, regions, layers and/or parts, these members, elements, regions, layers and/or parts are not be limited by these terms. These terms are only used to distinguish one member, element, region, layer and/or part from another member, element, region, layer and/or part. Thus, for example, a first member, element, region, layer and/or part discussed below could be termed a second member, element, region, layer and/or part without departing from the teachings of the present invention.

DETAILED DESCRIPTION OF THE DRAWINGS

The present description includes, among other features, a semiconductor device, which has a semiconductor die and conductive bumps on the same surface of a single layer substrate. The single layer substrate has, among other features, a configuration that replaces the multiple-layer substrates used in previous devices.

In one embodiment, the semiconductor device includes a first single layer substrate having a first insulation layer and a plurality of first conductive patterns on a first surface of the first insulation layer. A first semiconductor die is on a first surface of the first single layer substrate and is electrically connected to the plurality of first conductive patterns. First conductive bumps are on the first surface of the first single layer substrate and electrically connected to the first semiconductor die through the plurality of first conductive patterns. A first encapsulant is configured to cover the first surface of the first single layer substrate and to expose the plurality of first conductive bumps.

In another embodiment, a manufacturing method of a semiconductor device includes, providing a single layer substrate including an insulation layer and a conductive pattern exposed on a first surface of the insulation layer, the single layer substrate attached to a first surface of a conductive carrier. The method includes mounting a semiconductor die on the first surface of the first insulation layer and electrically coupled to the conductive pattern. The method includes forming a plurality of conductive bumps on the first surface of the first insulation layer and electrically connected to the conductive pattern. The method includes a first encapsulant on the first surface of the insulation layer, wherein the first encapsulant is configured to expose portions of the plurality of conductive bumps.

In another embodiment of the method, providing the single layer substrate includes forming the insulation layer on the first surface of the conductive carrier, forming throughholes extending through the insulation layer in a predetermined pattern, forming a plurality of conductive vias in the throughholes, and forming the conductive pattern on the first surface of the insulation layer and electrically connected to the plurality of conductive vias. In one embodiment, the conductive carrier is removed in a subsequent step.

Referring to FIG. 1, a flowchart illustrating a manufacturing method of a semiconductor device in accordance with a first embodiment is illustrated. As illustrated in FIG. 1, the manufacturing method in accordance with the first embodiment includes providing or forming a first single layer substrate (S1), mounting a first semiconductor die (S2), forming first conductive bumps (S3), first encapsulating (S4), forming a protection layer (S5) and singulating (S6).

Figure 2A:
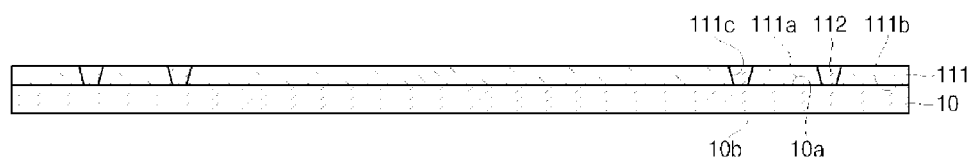
FIGS. 2A to 2I illustrate cross-sectional views of a semiconductor device at various process steps in accordance with the manufacturing method illustrated in FIG. 1.
Figure 2B:
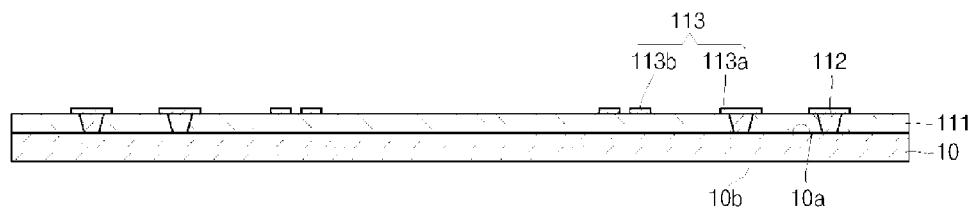
Figure 2C:
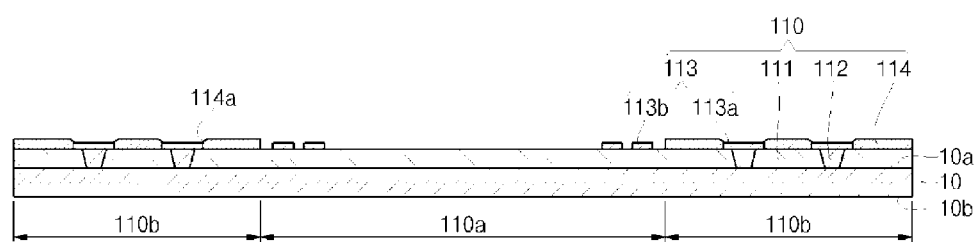

Referring to FIGS. 2A to 2I, cross-sectional views of an embodiment of a semiconductor device at various process steps in accordance with the manufacturing method in FIG. 1 are illustrated. Hereinafter, the manufacturing method of the semiconductor device shown in FIG. 1 will be described with reference to 2A to 2I. In FIGS. 2A to 2C, cross-sectional views of the step of forming the first single layer substrate (S1) in the manufacturing method of FIG. 1 are illustrated. In the step forming of the first single layer substrate (S1), a first single layer substrate 110 is provided by forming a first insulation layer 111 on a first surface 10*a* of a planar plate-shaped conductive carrier 10 and forming a plurality of first conductive patterns 113 on a first surface 111*a* of the first insulation layer 111. In one embodiment, the first single layer substrate 110 can include a central area 110*a* and a peripheral area 110*b* formed at an exterior side of the central area 110*a*, and can be generally shaped as a plate-like structure. In addition, the first surface 111*a* of the first insulation layer 111 can be a first surface of the first single layer substrate 110, and the second surface 111*b* of the first insulation layer 111 can be a second surface of the first single layer substrate 110.

As illustrated in FIG. 2A, in the step of forming the first single layer substrate (S1), the first insulation layer 111 formed on the first surface 10*a* of the conductive carrier 10 is provided with a predetermined pattern and a predetermined thickness. In one embodiment, a plurality of conductive vias 112 is subsequently formed as described further hereinafter.

In some embodiments, the conductive carrier 10 is made of a conductive material and has a planar plate-like shaped first surface 10*a* and a second surface 10*b* opposite to the first surface 10*a*. In one embodiment, the first insulation layer 111, which has the first surface 111*a* and the second surface 111*b* opposite to the first surface 111*a*, is formed such that the second surface 111*b* of the first insulation layer 111 is closely adhered to the first surface 10*a* of the conductive carrier 10. By way of example, the first insulation layer 111 can be a semi-curable resin or prepreg made of a resin and a hardening agent, but aspects of the present embodiment are not limited thereto. The first insulation layer 111 can include a plurality of throughholes 111*c* for exposing the first surface 10*a* of the conductive carrier 10 to the first surface 110*a* of the first insulation layer 111. In one embodiment, the throughholes 111*c* can be holes passing through the first surface 111*a* and the second surface 111*b* of the first insulation layer 111. In one embodiment, the throughholes 111*c* of the first insulation layer 111 can be positioned on a peripheral area 110*b* of the first single layer substrate 110.

In one embodiment, the plurality of conductive vias 112 are formed in the throughholes 111*a* of the first insulation layer 111 by electroplating using the conductive carrier 10 as one electrode to fill the plurality of throughholes 111*a*. In one embodiment, the plurality of conductive vias 112 can be provided in the peripheral area 110*b* of the first single layer substrate 110. In some embodiments, at least some of the conductive vias 112 extend all the way through the first insulation layer 111 and physically contact the conductive carrier 10.

In other embodiments, the order of forming the first insulation layer 111 and the conductive vias 112 can be reversed. For example, a photoresist layer having a pattern similar in shape to the first insulation layer 111 can be first formed on the conductive carrier 10 to include openings for forming the plurality of conductive vias 112. The plurality of conductive vias 112 then can be formed by electroplating material within the openings and the photoresist pattern can be subsequently removed. Thereafter, the first insulation layer 111 can be formed on the conductive carrier 10 and at least latterly surrounding the plurality of conductive vias 112.

As illustrated in FIG. 2B in one embodiment of the step of forming the first single layer substrate (S1), a plurality of conductive patterns 113 electrically connected to the plurality of conductive vias 112 are formed thereafter on or exposed in the first surface 111*a* of the first insulation layer 111 using, for example, an electroplating process. In some embodiments, one side 113*a* of each of the conductive patterns 113 can be positioned in the peripheral area 110*b* of the first single layer substrate 110 to be electrically connected to the conductive vias 112 and the other side 113*b* of each of the conductive patterns 113 can be positioned in the central area 110*a*. That is to say, in one embodiment the one side 113*a* and the other side 113*b* of each of the conductive patterns 113 are spaced apart from each other in the cross-sectional view of FIG. 2B, but are connected to each other in a plan view of the semiconductor device. Although the conductive patterns 113 are generally illustrated as being on top of the first insulation layer 111, it is understood that in some embodiments the conductive patterns can be recessed within the first surface 111*a* of the first insulation layer.

As illustrated in FIG. 2C, in the step of forming the first single layer substrate (S1), a solder mask 114 can be formed on the first surface 111*a* of the first insulation layer 111 and configured to expose at least portions of the conductive patterns 113 to the outside. In one embodiment, the solder mask 114 can be formed on the peripheral area 110*b* of the first single layer substrate 110. In some embodiments, the solder mask 114 can be formed on the first surface 111*a* of the first insulation layer 111 in the peripheral area 110*b* of the first single layer substrate 110 and can have openings 114*a* to at least some of the conductive patterns 113 to the outside and configured to be connected to conductive structures, such as first conductive bumps 130 (illustrated in FIG. 2E).

In accordance with the present embodiment, since the first single layer substrate 110 includes the first insulation layer 111 and the conductive vias 112 and is formed by the conductive patterns 113 formed on or exposed in the first surface 111*a* of the first insulation layer 111, it can be formed to have a reduced or smaller thickness than a printed circuit board or a redistribution layer having a multi-layered structure as in related devices.

Figure 2D:
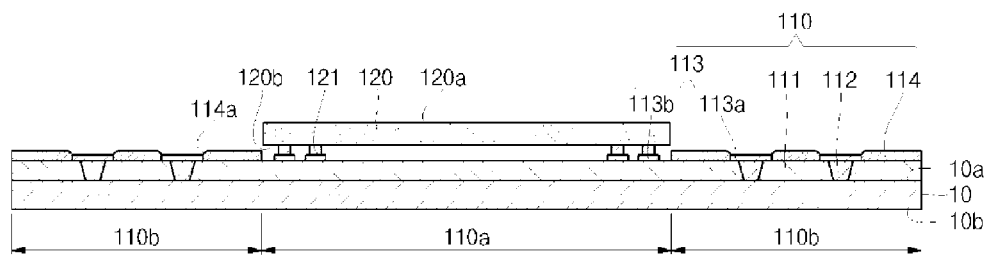

Referring to FIG. 2D, a cross-sectional view of an embodiment of the step of mounting the first semiconductor die (S2) in the manufacturing method of FIG. 1 is illustrated. In one embodiment, the first semiconductor die 120 can be mounted on the first surface 111*a* of the first single layer substrate 110 and electrically connected to the conductive patterns 113. In one embodiment, the first semiconductor die 120 can be connected to the other side 113*b* of each of the plurality of conductive patterns 113 positioned in the central area 110*a* on the first surface 111*a* of the first single layer substrate 110. In one embodiment, the first semiconductor die 120 can have a planar plate-like shaped first surface 120*a* and a second surface 120*b* opposite to the first surface 120*a*, and conductive bumps 121 can be formed on the second surface 120b. In one embodiment, the first semiconductor die 120 can be electrically connected to the conductive patterns 113 in cooperation with the conductive bumps 121. In some embodiments, the conductive bumps 121 can further include a solder cap at an end of each of the conductive bumps 121 to facilitate an easier connection process o the conductive patterns 113.

Figure 2E:
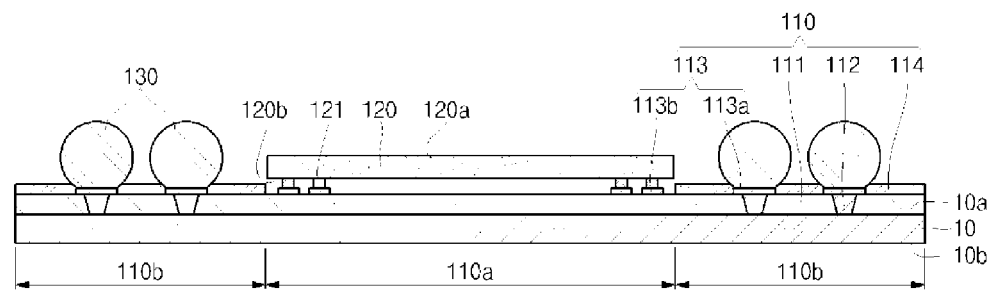

Referring to FIG. 2E, a cross-sectional view of an embodiment of the step of forming the first conductive bumps (S3) in the manufacturing method of FIG. 1 is illustrated. In one embodiment, the first conductive bumps 130 can be formed on the first surface 111a of the first single layer substrate 110 and configured to be electrically connected to the conductive patterns 113. In some embodiments, each of the first conductive bumps 130 can be formed at one side 113a of each of the plurality of conductive patterns 113 positioned in the peripheral area 110b of the first surface 111a of the first single layer substrate 110. In one embodiment, the first conductive bumps 130 can be formed on the first surface 111a of the first single layer substrate 110, which is substantially coplanar with a surface on which the first semiconductor die 120 is mounted. In addition, in one embodiment the first conductive bumps 130 are electrically connected to the first semiconductor die 120 through the conductive patterns 113. In one embodiment, the first conductive bumps 130 can be electrically connected to the conductive patterns 113 exposed to the outside through the solder mask 114. In some embodiments, the first conductive bumps 130 can be solder balls, but aspects of the present embodiment are not limited thereto.

Figure 2F:
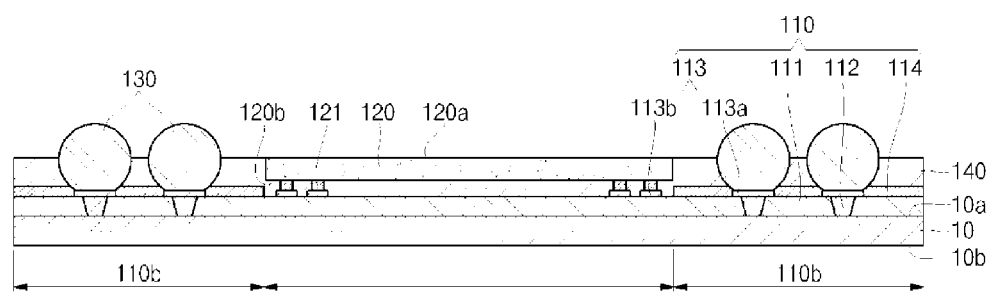

Referring to FIG. 2F, a cross-sectional view of an embodiment of the step of first encapsulating (S4) in the manufacturing method of FIG. 1 is illustrated. In one embodiment, the first surface 111a of the first single layer substrate 110 can be first encapsulated using a first encapsulant 140 to cover the first surface 111a of the first single layer substrate 110 having the first semiconductor die 120 and the first conductive bumps 130 formed thereon. In one embodiment, the first encapsulant 140 is configured to expose a first surface 120a of the first semiconductor die 120 and the plurality of first conductive bumps 130 to the outside of the first encapsulant 140. The first encapsulant 140 is configured to protect the first surface 111a of the first single layer substrate 110 and the first semiconductor die 120 from external environments. In accordance with the present embodiment, the first surface 110a of the first semiconductor die 120 is exposed to the outside of the first encapsulant 140, thereby improving heat dissipating performance of the first semiconductor die 120 and the semiconductor device 100. As illustrated in FIG. 2F, the first encapsulant 140 laterally surrounds portions of the first conductive bumps 130 proximate to the first surface 111a of the first single layer substrate 110.

Figure 2G:
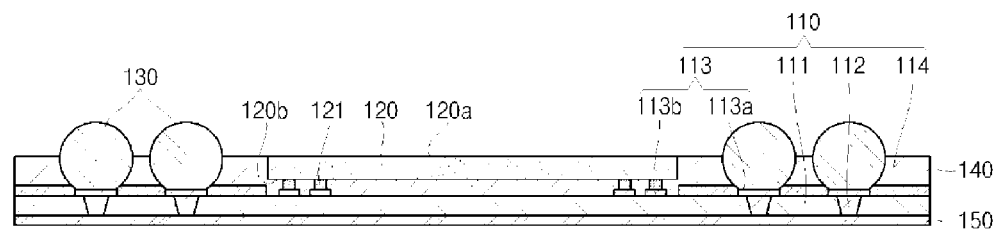

Referring to FIG. 2G, a cross-sectional view of an embodiment of the step of forming the protection layer (S5) in the manufacturing method of FIG. 1 is illustrated. In one embodiment, the conductive carrier 10 is removed from the second surface 111b of the first single layer substrate 110, and a protection layer 150 is formed to cover at least the second surface 111b of the first single layer substrate 110. After the conductive carrier 10 is removed using, for example, a grinding process, residues of the conductive carrier 10 remaining on the second surface 111b of the first single layer substrate 110 can be removed using, for example, an etching process. After removing the conductive carrier 10, the protection layer 150 can be formed on the second surface 111b of the first single layer substrate 110 exposed by removing the conductive carrier 10. In some embodiments, the protection layer 150 can include a polymeric resin or an insulating resin and can be formed on the second surface 111b of the first single layer substrate 110 as a liquid coating, a tape or a film, but aspects of the present embodiment are not limited thereto. The protection layer 150 can be configured to protect the second surface 111b of the first single layer substrate 110 from external environments.

Figure 2H:
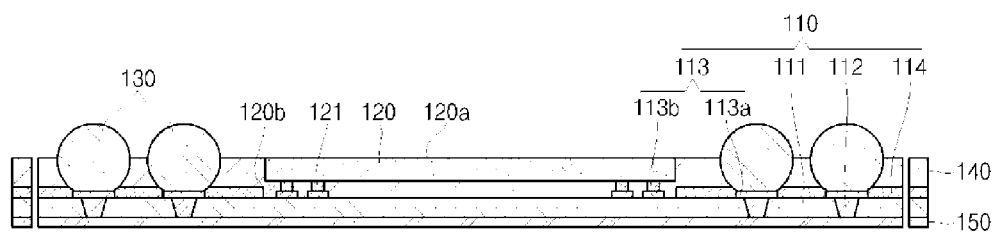
Figure 2I:
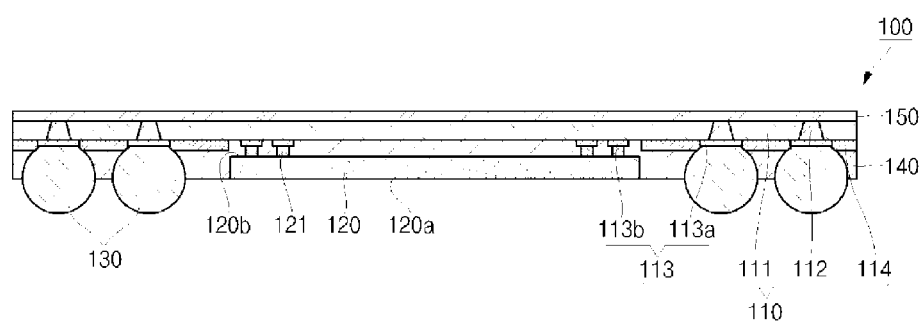

Referring to FIGS. 2H and 2I, cross-sectional views of an embodiment of the step of singulating (S6) in the manufacturing method of FIG. 1 are illustrated. In one embodiment, the first single layer substrate 110, the first encapsulant 140 and the protection layer 150 are diced, thereby singulating into each of the individual semiconductor devices 100. The dicing may be performed by blade dicing or using a dicing tool, but aspects of the present embodiment are not limited thereto.

In accordance with the present embodiment, each of the semiconductor devices 100 can refer to a semiconductor device configured such that the first single layer substrate 110 having at least one first semiconductor die 120 and a plurality of first conductive bumps 130 mounted thereon is protected by the first encapsulant 140 and the protection layer 150. That is to say, in the singulating (S6) step, the first single layer substrate 110 having the plurality of first semiconductor die 120 mounted thereon is divided into individual semiconductor devices 100 each having at least one first semiconductor die 120.

Additionally, in accordance with the present embodiment of the semiconductor device 100, the first semiconductor die 120 and the first conductive bumps 130 are formed on the same surface of the first single layer substrate 110, and the first single layer substrate 110 is used without using a multi-layer substrate as in related devices, thereby reducing the overall thickness of the semiconductor device 100.

Figure 3:
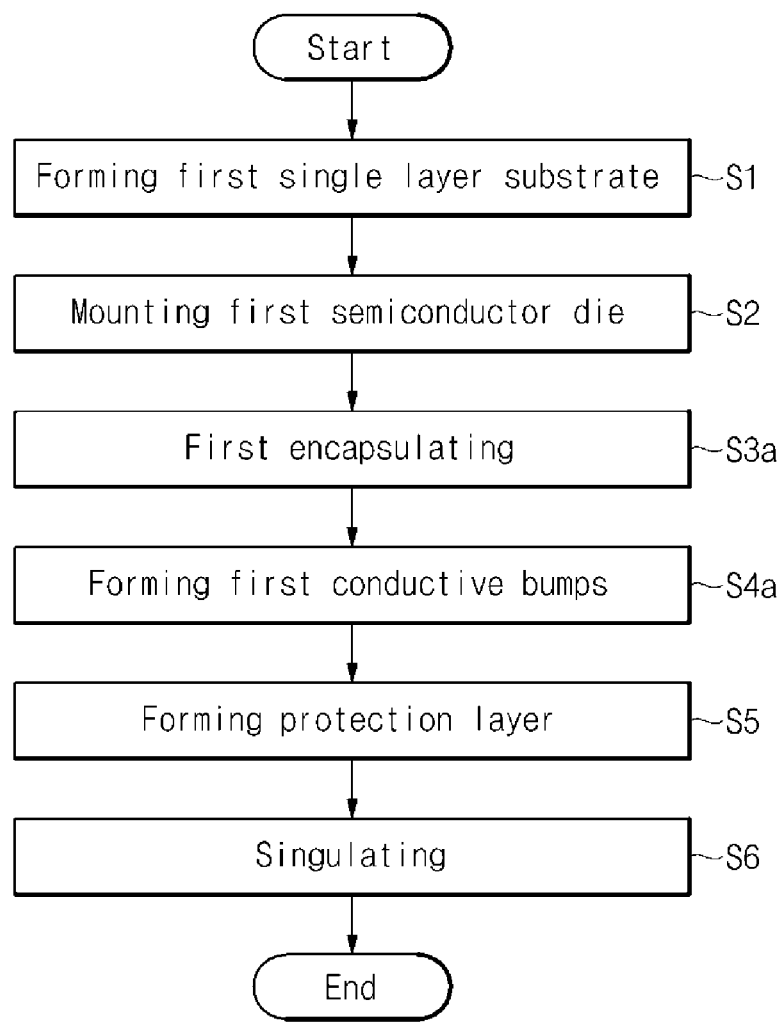
FIG. 3 is a flowchart illustrating a manufacturing method of a semiconductor device in accordance with another embodiment of the present invention.

FIG. 3 is a flowchart illustrating a manufacturing method of a semiconductor device 200 in accordance with another embodiment. As illustrated in FIG. 3, one embodiment includes forming a first single layer substrate (S1), mounting a first semiconductor die (S2), first encapsulating (S3a), forming first conductive bumps (S4a), forming a protection layer (S5) and singulating (S6). In the present embodiment, the forming of the first single layer substrate (S1), the mounting of the first semiconductor die (S2), the forming the protection layer (S5) and the singulating (S6) illustrated in FIG. 3 are similar to the manufacturing method of the semiconductor device 100 illustrated in FIGS. 1 and 2A to 2I. Therefore, the following description is made with regard to the steps including first encapsulating (S3a) and forming of the first conductive bumps (S4a), which have different features from the manufacturing method of the semiconductor device 100 illustrated in FIGS. 1 and 2A to 2I.

In addition, the semiconductor device 200 manufactured by the present embodiment has a similar configuration to the semiconductor device 100 shown in FIG. 2I. However, in the present embodiment, a first encapsulant 240 and first conductive bumps 230 have different shapes according to the order of forming the first encapsulant 240 and the first conductive bumps 230 as described hereinafter.

Figure 4A:
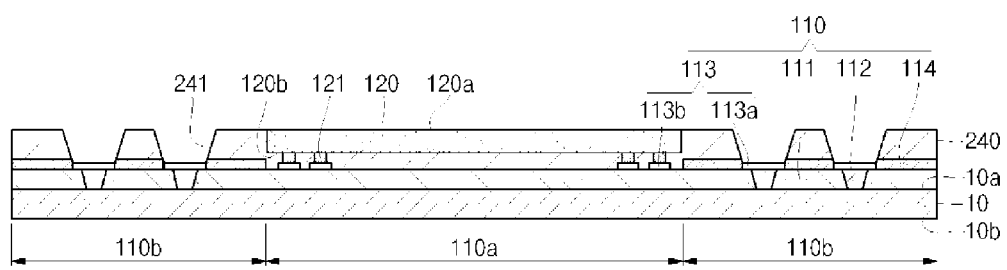
FIGS. 4A and 4B illustrate cross-sectional views of a semiconductor device at various process steps in accordance with the manufacturing method illustrated in FIG. 3.

Referring to FIG. 4A, a cross-sectional view of an embodiment of the step of first encapsulating (S3a) in the manufacturing method of the semiconductor device 200 shown in FIG. 3 is illustrated. In one embodiment, a first surface 111a of the first single layer substrate 110, where a first semiconductor die 120 is mounted, is encapsulated using the first encapsulant 240. One or more openings 241 are formed in the first encapsulant 240 to expose a plurality of conductive patterns 113 to the outside. In one embodiment, the openings 241 can be configured to expose the conductive patterns 113 positioned in a peripheral area 110*b* of a first single layer substrate 110 to the outside. In addition, the first encapsulant 240 can be configured to expose a first surface 120*a* of the first semiconductor die 120 to the outside. The first encapsulant 240 can expose the first surface 120*a* of the first semiconductor die 120 to the outside using, for example, a grinding process after the first encapsulating step covers the first surface 120*a* of the first semiconductor die 120. In one embodiment, the first surface 120*a* of the first semiconductor die 120 is exposed to the outside of the first encapsulant 240, thereby improving heat dissipating performance of the first semiconductor die 120 and the semiconductor device 200. The first encapsulant 240 is configured to protect the first surface 111*a* of the first single layer substrate 110 and the first semiconductor die 120 from external environments.

Figure 4B:
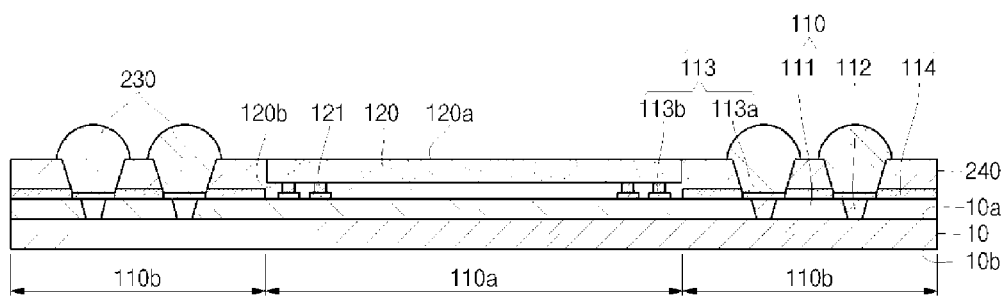

Referring to FIG. 4B, a cross-sectional view of an embodiment, of the step of forming of the first conductive bumps (S4*a*) in the manufacturing method of the semiconductor device 200 shown in FIG. 3 is illustrated. In one embodiment, the first conductive bumps 230 are formed in the opening 241 of the first encapsulant 240 and configured to be electrically connected to the conductive patterns 113 exposed to the outside through the first encapsulant 240. In one embodiment, the first conductive bumps 230 are formed on the first surface 111*a* of the first single layer substrate 110, which is the same surface as the surface where the first semiconductor die 120 is mounted. The first conductive bumps 230 are electrically connected to the conductive patterns 113 exposed in the opening 241 of the first encapsulant 240. In one embodiment, the first conductive bumps 230 can be electrically connected to the first semiconductor die 120 through the conductive patterns 113. The first conductive bumps 130 may be solder balls, but aspects of the present embodiment are not limited thereto.

Figure 5:
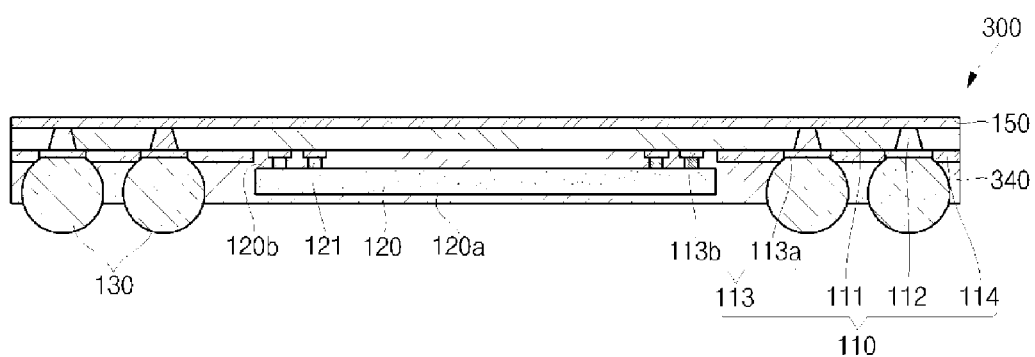
FIG. 5 illustrates a cross-sectional view of a semiconductor device in accordance with a further embodiment of the present invention.

Referring to FIG. 5, a cross-sectional view of a semiconductor device 300 according to a further embodiment is illustrated. In one embodiment, the semiconductor device 300 includes a first single layer substrate 110, a first semiconductor die 120 mounted in a central area 110*a* on a first surface 111*a* of the first single layer substrate 110, first conductive bumps 130 formed in a peripheral area 110*b* on the first surface 111*a* of the first single layer substrate 110, a first encapsulant 340 formed to cover the first surface 111*a* of the first single layer substrate 110, and a protection layer 150 formed to cover the second surface 111*b* of the first single layer substrate 110.

The semiconductor device 300 has a similar configuration to the semiconductor device 100 illustrated in FIG. 2I, except the semiconductor device 300 is formed such that the first encapsulant 340 entirely covers the first semiconductor die 120. In one embodiment, the first encapsulant 340 is formed to cover both of the first semiconductor die 120 and the first surface 111*a* of the first single layer substrate 110, thereby protecting the first semiconductor die 120 and the first single layer substrate 110 from external environments.

Figure 6:
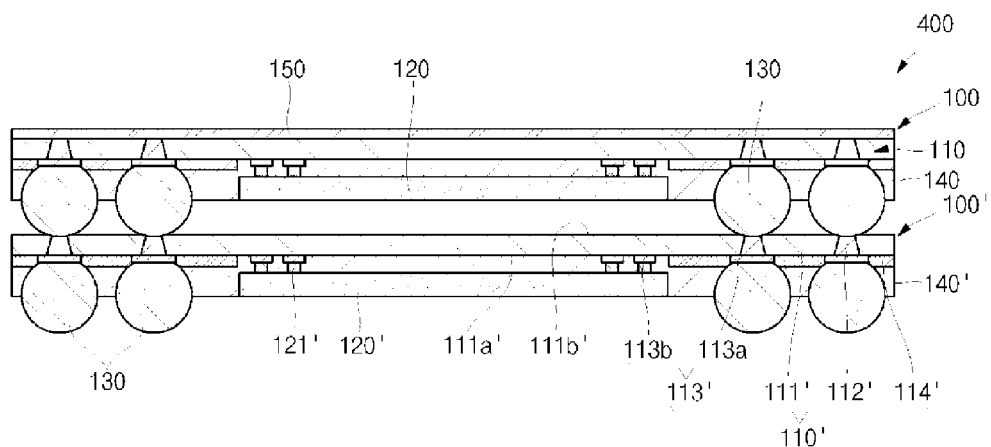
FIG. 6 illustrates a cross-sectional view of a semiconductor device in accordance with a still further embodiment of the present invention.

Referring to FIG. 6, a cross-sectional view of a semiconductor device 400 according to a still further embodiment is illustrated. In one embodiment, the semiconductor device 400 has a Package-on-Package (PoP) structure having the semiconductor device 100 illustrated in FIG. 2I stacked in multiple layers. In one embodiment, the semiconductor device 400 illustrated in FIG. 6 includes a first semiconductor device 100 and a second semiconductor device 100' and is configured such that the first semiconductor device 100 is stacked on the second semiconductor device 100'.

In one embodiment, the first semiconductor device 100 includes a first single layer substrate 110, a first semiconductor die 120 mounted in a central area 110*a* on a first surface 111*a* of the first single layer substrate 110, first conductive bumps 130 formed in a peripheral area 110*b* on the first surface 111*a* of the first single layer substrate 110, a first encapsulant 140 formed to cover the first surface 111*a* of the first single layer substrate 110, and a protection layer 150 formed to cover the second surface 111*b* of the first single layer substrate 110.

In one embodiment, the second semiconductor device 100' includes a second single layer substrate 110', a second semiconductor die 120' mounted in a central area 110*a* on a first surface 111*a*' of the second single layer substrate 110', second conductive bumps 130' formed in a peripheral area 110*b* on the first surface 111*a*' of the second single layer substrate 110', and a first encapsulant 140' formed to cover the first surface 111*a*' of the second single layer substrate 110'.

The first semiconductor device 100 has a similar configuration to the semiconductor device 100 illustrated in FIG. 2I. In addition, the second semiconductor device 100' has a similar configuration to the semiconductor device 100 illustrated in FIG. 2I, except for a configuration of the protection layer 150. In one embodiment, the second semiconductor device 100' is exposed to the outside of the second surface 111*b*' of the second single layer substrate 110'. In another embodiment, the second semiconductor device 100' can include the protection layer 150 and openings can be provided in the protection layer 150 to allow for electrical connection.

Additionally, in one embodiment of the second semiconductor device 100', the second conductive vias 112' of the second surface 111*b*' of the second single layer substrate 110' exposed to the outside are electrically connected to the first conductive bumps 130 of the first semiconductor device 100. Therefore, the first semiconductor device 100 is stacked on the second single layer substrate 110' of the second semiconductor device 100' to provide a PoP configuration.

In view of all the above, it is evident that a novel method and structure are disclosed. Included, among other features, is a single layer substrate having an insulation layer a conductive pattern on a first surface of the insulation layer. A semiconductor die is attached to the first surface of the insulation layer and is electrically connected to the conductive pattern. Conductive bumps are also on the first surface of the insulation layer and electrically connected to the conductive pattern. An encapsulant overlaps portions of the first surface of the insulation layer and further covers and least portions of the semiconductor die. The encapsulant is configured to leave at least portions of the conductive bumps exposed. The single layer substrate with the semiconductor die and the conductive bumps on the same side of the single layer substrate provide, among other features, a semiconductor device having a reduced thickness compared to related devices using multi-layered substrates and placing the semiconductor die and the conductive bumps on opposite sides of the multi-layered substrate. In one embodiment, a portion of the semiconductor die can be left exposed to provide, among other features enhanced heat dissipation benefits.

While the subject matter of the invention is described with specific preferred embodiments and example embodiments, the foregoing drawings and descriptions thereof depict only typical embodiments of the subject matter and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments, as would be understood by those skilled in the art.

What is claimed is:

1. A semiconductor device comprising:
    a first single layer substrate having a first insulation layer and a plurality of first conductive patterns on a first surface of the first insulation layer;
    a first semiconductor die disposed adjacent a first surface of the first single layer substrate and electrically coupled to the plurality first conductive patterns;
    first conductive bumps disposed adjacent the first surface of the first single layer substrate and electrically coupled to the first semiconductor die through the plurality of first conductive patterns; and
    a first encapsulant covering the first surface of the first single layer substrate and covering portions of the first conductive bumps, wherein other portions of the first conductive bumps are exposed to the outside of the semiconductor device.

2. The semiconductor device of claim 1, wherein the first single layer substrate consists essentially of:
    the first insulation layer having the first surface and a second surface opposite to the first surface;
    a plurality of first conductive vias extending from the first surface to the second surface of the first insulation layer; and
    the plurality of first conductive patterns on the first surface of the first insulation layer, which are electrically coupled to the plurality of first conductive vias.

3. The semiconductor device of claim 2, wherein the plurality of first conductive vias and the plurality of first conductive patterns comprise electroplated structures.

4. The semiconductor device of claim 2, wherein the first single layer substrate includes a central area connected to the first semiconductor die and a peripheral area positioned at an exterior side of the central area and connected to the first conductive bumps.

5. The semiconductor device of claim 1, wherein the first semiconductor die has a first surface and a second surface opposite to the first surface and includes a plurality of conductive bumps provided on the second surface, and wherein the plurality of conductive bumps are electrically coupled to the plurality of first conductive patterns.

6. The semiconductor device of claim 5, wherein the first encapsulant is interposed between the first semiconductor die and the first single layer substrate and covers lateral surfaces of the first semiconductor die while exposing at least a portion of the first surface of the first semiconductor die.

7. The semiconductor device of claim 1, wherein the first encapsulant overlaps and covers both the first surface of the first single layer substrate and the first semiconductor die, and wherein the first encapsulant laterally surrounds portions of the first conductive bumps proximate to the first surface of the first single layer substrate.

8. The semiconductor device of claim 1, further comprising a protection layer entirely covering the second surface of the first single layer substrate.

9. The semiconductor device of claim 8, further comprising:
    a second single layer substrate including a second insulation layer having a first surface and a second surface opposite to the first surface, a plurality of second conductive vias extending from the first surface to the second surface of the second insulation layer, and a plurality of second conductive patterns on the first surface of the second insulation layer and electrically connected to the second conductive vias;
    a second semiconductor die disposed adjacent a first surface of the second single layer substrate and electrically connected to the second conductive patterns;
    second conductive bumps disposed adjacent the first surface of the second single layer substrate and electrically connected to the second semiconductor die through the second conductive patterns; and
    a second encapsulant covering the first surface of the second single layer substrate while exposing the plurality of second conductive bumps,
    wherein the first conductive bumps are electrically connected to the second conductive vias exposed to the second surface of the second insulation layer.

10. The semiconductor device of claim 9, wherein:
    the first single layer substrate consists of the first insulation layer, the plurality of first conductive patterns, and a plurality of first conductive vias extending from the first surface to the second surface of the first insulation layer; and
    the second single layer substrate consists of the second insulation layer, the plurality of second conductive vias, and the plurality of second conductive patterns.

11. A semiconductor device comprising:
    a single layer substrate including a single insulation layer and a conductive pattern exposed on a first surface of the single insulation layer;
    a semiconductor die adjacent the first surface of the single insulation layer and electrically coupled to the conductive pattern, wherein the semiconductor die has a first major surface facing the single layer substrate and a second major surface opposite to the first major surface;
    a plurality of conductive bumps adjacent the first surface of the single insulation layer and electrically coupled to the conductive pattern, wherein distal ends of each of the plurality of conductive bumps are disposed further away from the single layer substrate than the second major surface of the semiconductor die; and
    a first encapsulant on the first surface of the single insulation layer, wherein the first encapsulant laterally surrounds portions of the plurality of conductive bumps, and wherein other portions of the conductive bumps are exposed to the outside of the semiconductor device.

12. The semiconductor device of claim 11, wherein the single layer substrate further comprises:
    a plurality of conductive vias extending through the single insulation layer, wherein the conductive pattern is electrically coupled to the plurality of conductive vias.

13. The semiconductor device of claim 12, wherein each of the plurality of conductive vias is in vertical alignment with one of the plurality of conductive bumps.

14. The semiconductor device of claim 11, wherein the plurality of conductive bumps is placed around a periphery of the single layer substrate and laterally spaced apart from a central portion of the single layer substrate.

15. The semiconductor device of claim 11 further comprising a protection layer entirely covering a second surface of the single insulation layer.

16. The semiconductor device of claim 11, wherein a portion of the first encapsulant laterally separates a vertical side surface of the semiconductor chip from a side surface of one of the plurality of conductive bumps.

17. The semiconductor device of claim 11, wherein the first encapsulant comprises vertically sloped sidewall surfaces adjoining each of the plurality of conductive bumps.

18. The semiconductor device of claim 11 further comprising:
   a solder mask on the first surface of the single insulation layer, the solder mask configured to expose at least portions of the conductive pattern, wherein the second surface of the semiconductor die exposed in a surface of the first encapsulant.

19. A semiconductor device comprising:
   a first single layer substrate comprising:
      a first insulation layer having a first surface and a second surface opposite to the first surface and
      a plurality of first conductive patterns on a first surface of the first insulation layer; and
      a plurality of first conductive vias extending through the first surface and the second surface of the first insulation layer, wherein the plurality of first conductive patterns on the first surface of the first insulation layer are electrically coupled to the plurality of first conductive vias;
   a first semiconductor die on a first surface of the first single layer substrate and electrically coupled to the plurality first conductive patterns;
   first conductive bumps formed on the first surface of the first single layer substrate and electrically coupled to the first semiconductor die through the plurality of first conductive patterns; and
   a first encapsulant configured to cover the first surface of the first single layer substrate and configured to expose the first conductive bumps.

20. The semiconductor device of claim 19, further comprising:
   a second single layer substrate including a second insulation layer having a first surface and a second surface opposite to the first surface, a plurality of second conductive vias extending through the first surface and the second surface of the second insulation layer, and a plurality of second conductive patterns on the first surface of the second insulation layer and electrically connected to the second conductive vias;
   a second semiconductor die mounted on a first surface of the second single layer substrate and electrically connected to the second conductive patterns;
   second conductive bumps formed on the first surface of the second single layer substrate and electrically connected to the second semiconductor die through the second conductive patterns; and
   a second encapsulant covering the first surface of the second single layer substrate while exposing the second conductive bumps,
   wherein the first conductive bumps are electrically connected to the second conductive vias exposed to the second surface of the second insulation layer.

* * * * *